United States Patent
Hisano et al.

(10) Patent No.: US 8,937,390 B2
(45) Date of Patent: Jan. 20, 2015

(54) SEMICONDUCTOR DEVICE HAVING A LIQUID COOLING MODULE

(71) Applicants: Nae Hisano, Chiyoda-ku (JP); Shigeo Ohashi, Chiyoda-ku (JP); Yasuo Osone, Chiyoda-ku (JP); Yasuhiro Naka, Chiyoda-ku (JP); Hiroyuki Tenmei, Chiyoda-ku (JP); Kunihiko Nishi, Chiyoda-ku (JP); Hiroaki Ikeda, Tokyo (JP); Masakazu Ishino, Tokyo (JP); Hideharu Miyake, Tokyo (JP); Shiro Uchiyama, Tokyo (JP)

(72) Inventors: Nae Hisano, Chiyoda-ku (JP); Shigeo Ohashi, Chiyoda-ku (JP); Yasuo Osone, Chiyoda-ku (JP); Yasuhiro Naka, Chiyoda-ku (JP); Hiroyuki Tenmei, Chiyoda-ku (JP); Kunihiko Nishi, Chiyoda-ku (JP); Hiroaki Ikeda, Tokyo (JP); Masakazu Ishino, Tokyo (JP); Hideharu Miyake, Tokyo (JP); Shiro Uchiyama, Tokyo (JP)

(73) Assignee: PS4 Luxco S.a.r.l., Luxembourg (LU)

( * ) Notice: Subject to any disclaimer, the term of this patent is extended or adjusted under 35 U.S.C. 154(b) by 0 days.

(21) Appl. No.: 14/199,078

(22) Filed: Mar. 6, 2014

(65) Prior Publication Data

US 2014/0183730 A1 Jul. 3, 2014

Related U.S. Application Data

(63) Continuation of application No. 12/683,085, filed on Jan. 6, 2010, now Pat. No. 8,704,352.

(30) Foreign Application Priority Data

Jan. 8, 2009 (JP) .................................. 2009-002106

(51) Int. Cl.
*H01L 23/48* (2006.01)
*H01L 23/02* (2006.01)
(Continued)

(52) U.S. Cl.
CPC ............ *H01L 24/14* (2013.01); *H01L 23/3128* (2013.01); *H01L 23/473* (2013.01);
(Continued)

(58) Field of Classification Search
USPC ................. 257/532, 686, 692, 714, 738, 778, 257/E21.499, E23.023, E23.098; 361/791; 438/107, 109
See application file for complete search history.

(56) References Cited

U.S. PATENT DOCUMENTS

| 5,883,426 A | 3/1999 | Tokuno et al. |
| 5,886,408 A | 3/1999 | Ohki et al. |

(Continued)

FOREIGN PATENT DOCUMENTS

| JP | 09-260554 A | 10/1997 |
| JP | 09-293808 A | 11/1997 |

(Continued)

OTHER PUBLICATIONS

"Wide Band/large-capacity-memory-loaded SMAFTI Package Technique" (NEC Technical Journal vol. 59, No. 5, 2006, pp. 46-49.
(Continued)

*Primary Examiner* — Dao H Nguyen
(74) *Attorney, Agent, or Firm* — Sughrue Mion, PLLC

(57) ABSTRACT

A semiconductor device comprises a mounting substrate, a semiconductor element provided above said mounting substrate, a package substrate provided above said mounting substrate with said semiconductor element therebetween and electrically connected to said semiconductor element via a primary connecting bump, a liquid cooling module cooling said semiconductor element by a liquid refrigerant, in which a heat receiving section of the liquid cooling module is disposed between said semiconductor element and said mounting substrate, and a plurality of secondary connecting bumps provided between said package substrate and said mounting substrate.

2 Claims, 16 Drawing Sheets

(51) Int. Cl.
   *H01L 23/00*    (2006.01)
   *H01L 23/31*    (2006.01)
   *H01L 23/473*   (2006.01)
   *H01L 23/34*    (2006.01)

(52) U.S. Cl.
   CPC ...... *H01L 23/34* (2013.01); *H01L 2224/16145* (2013.01); *H01L 2224/16225* (2013.01); *H01L 2224/73204* (2013.01); *H01L 2225/06565* (2013.01); *H01L 2924/15311* (2013.01); *H01L 2924/15321* (2013.01); *H01L 2224/32225* (2013.01); *H01L 2224/73253* (2013.01); *H01L 2924/18161* (2013.01)
   USPC ........... 257/778; 257/532; 257/686; 257/692; 257/714; 257/738; 257/E21.499; 257/E23.023; 257/E23.098; 361/791; 48/107; 48/109

(56) References Cited

U.S. PATENT DOCUMENTS

| | | |
|---|---|---|
| 6,760,224 B2 | 7/2004 | Moden et al. |
| 7,148,554 B2 * | 12/2006 | Nah et al. ...................... 257/532 |
| 7,196,411 B2 | 3/2007 | Chang |
| 7,334,630 B2 | 2/2008 | Goodson et al. |
| 7,656,030 B2 * | 2/2010 | Osone et al. .................. 257/728 |
| 7,719,110 B2 | 5/2010 | Zhao et al. |
| 2002/0185718 A1 | 12/2002 | Mikubo et al. |
| 2003/0146519 A1 * | 8/2003 | Huang ........................... 257/778 |
| 2004/0195667 A1 | 10/2004 | Karnezos |
| 2004/0251530 A1 | 12/2004 | Yamaji |
| 2007/0170576 A1 * | 7/2007 | Lee et al. ...................... 257/686 |
| 2009/0057881 A1 | 3/2009 | Arana et al. |
| 2011/0115085 A1 * | 5/2011 | Kuwabara ..................... 257/738 |
| 2013/0147044 A1 * | 6/2013 | Eun ............................... 257/738 |

FOREIGN PATENT DOCUMENTS

| | | |
|---|---|---|
| JP | 2001-237582 A | 8/2001 |
| JP | 2005-005529 A | 1/2005 |
| JP | 2005-244143 A | 9/2005 |
| JP | 2007-010277 A | 1/2007 |

OTHER PUBLICATIONS

"Water-cooling Technique for Hot Devices, Aiming at Popularization by Standardization and Downsizing" (Nikkei Electronics, Jul. 21, 2003, pp. 59-68).

* cited by examiner

SEMICONDUCTOR DEVICE HAVING A LIQUID COOLING MODULE

CROSS REFERENCE TO RELATED APPLICATIONS

This application is a Continuation Application of U.S. application Ser. No. 12/683,085 filed Jan. 6, 2010, which claims priority from Japanese Patent Application No. 2009-002106 filed Jan. 8, 2009, the disclosures of which are incorporated herein by reference in their entirety.

BACKGROUND OF THE INVENTION

1. Field of the Invention

The present invention relates to a semiconductor device.

2. Description of the Related Art

Conventionally, in order to increase speed and capacity in a semiconductor package, there is an example of stacking a number of memory elements in layers in one package, an example of loading a memory element and a logic element together in one package, or the like.

For example, JP 2005-244143 describes a semiconductor device in which a number of semiconductor memories are mounted on the top surface of a resin interposer (corresponding to a package substrate), and in which an interface chip is stacked on its top layer with a through electrode with a short wiring distance.

Further, "Wide band/large-capacity-memory-loaded SMAFTI package technique" (NEC Technical Journal vol. 59, No. 5/2006, pp. 46-49) describes a general-purpose LSI package in which a micro wiring body (corresponding to a package substrate) called an FTI (Feedthrough Interposer) is inserted between a logic chip and a large-capacity memory chip.

In a semiconductor package, in the case in which the heating value of a semiconductor element is higher than an allowable value, a radiator is mounted on the package in order to suppress a rise in the temperature of the semiconductor element. Therefore, a technique of reducing the thermal resistance between the radiator and the semiconductor element is required.

For example, JP 2005-244143 describes the configuration in which an interface chip with a large heating value is mounted on the uppermost layer near a radiator plate.

Further, JP 9-260554 describes a semiconductor package in which a heat transfer plate having high thermal conductivity is provided between the undersurface of a semiconductor element and a mounting substrate.

JP 9-293808 describes the configuration in which a metallic heat release fin is mounted on the back surface of the semiconductor element exposed on the top surface of a package, via an adhesive.

Recently, a liquid-cooling method which makes noise reduction and high heat radiating performance compatible has been put to practical use. For example, FIG. 2 of "Water-cooling technique for hot devices, Aiming at popularization by standardization and downsizing" (Nikkei Electronics, 2003. 7.21, pp. 59-68) illustrates an example of practical use in which heat is transported to the heat radiating section disposed at a distant position from the heat receiving section disposed on a microprocessor. A water-cooling module includes a heat receiving section (also called a heat absorbing section), a reservoir tank, a heat radiating section (also called a heat exchanger), a pump and a pipe connecting them, as main components.

Further, there is an example of using a sheet, in order to downsize the component of liquid cooling. For example, JP 2001-237582 describes the configuration in which a heat radiating section is formed into a bag shape by a flexible sheet having high heat resistance and high thermal conductivity. JP 2007-10277 describes the configuration in which a heat radiator and a heat absorber are formed by bags made of a water-resistant sheet.

As the best liquid-cooling method, there is an example of the development of a cooling module with high efficiency that uses a fine micro-channel of 200 µm or less. For example, FIG. 7 of "Water-cooling technique for hot devices, Aiming at popularization by standardization and downsizing" illustrates a configuration in which a micro-channel/heat sink is mounted on the upper portion of the microprocessor via grease. The micro-channel/heat sink is configured by forming a trench having a width of 150 µm or less and a depth of 200 µm in a thin plate of silicone by an MEMS technique.

Further, in a case of a package in which chips are stacked in layers, there is also an example of cooling individual chips in the package. For example, JP 2005-5529 describes the method for liquid-cooling the inside of a package by using a hollow portion formed by stacking semiconductor elements via bumps as a channel.

In order to obtain high speed transmission performance with a stacked memory by a through electrode, the interface chip is desirably disposed in a lower layer instead of an upper layer of the stacked memory. Because, in the case in which the interface chip which controls signal distribution is on the upper layer of the stacked memory, if the stacked memory becomes thicker, the transmission path will become longer, and therefore, a signal received from the solder ball, which is the input and output terminal of the package, would be delayed.

As described in "Wide band/large-capacity-memory-loaded SMAFTI package technique", a logic chip on the undersurface of a package substrate is advantageous with respect to signal transmission. However, when the heating value of the logic chip becomes large, space for mounting the fin described in JP 9-293808, and the water-cooling jacket illustrated in FIG. 2 of "Water-cooling technique for hot devices, Aiming at popularization by standardization and downsizing" cannot be ensured. Meanwhile, as described in JP 9-260554, a heat transfer plate can be provided in this space. However, the heat radiating ability of the mounting substrate is too small to cool the logic element that has a large heating value (of tens of watts).

Further, the periphery of a logic chip is surrounded by mounting bumps, and therefore, even if a thin cooling jacket comprising the micro-channel illustrated in FIG. 7 of "Water-cooling technique for hot devices, Aiming at popularization by standardization and downsizing" is mounted, space for receiving a pipe cannot be provided. Meanwhile, the liquid-cooling method in which a refrigerant flows into a space between the chips inside the package is likely to cause corrosion to the circuit surface between the chips and to electrical connection portions of the upper and lower chips.

Accordingly, in a semiconductor device in which a mounting substrate, the semiconductor element and a package substrate are sequentially stacked in layers, a technique for efficiently cooling a semiconductor element is needed.

SUMMARY

In one embodiment, there is provided a semiconductor device that comprises a mounting substrate, a semiconductor element provided above said mounting substrate, a package substrate provided above said mounting substrate with said semiconductor element therebetween, and electrically connected to said semiconductor element via a primary connecting bump, a liquid cooling module cooling said semiconductor element by a liquid refrigerant, wherein a heat receiving section of said liquid cooling module is disposed between said semiconductor element and said mounting substrate, and a plurality of secondary connecting bumps provided between said package substrate and said mounting substrate.

In another embodiment, there is provided a semiconductor device that comprises a mounting substrate, a first semiconductor element provided above said mounting substrate, a package substrate provided above said mounting substrate with said first semiconductor element therebetween, and electrically connected to said first semiconductor element via a primary connecting bump, a second semiconductor element provided above said first semiconductor element with said package substrate therebetween, and electrically connected to said first semiconductor element via said primary connecting bump and a through electrode provided at said package substrate, a liquid cooling module cooling said semiconductor element by a liquid refrigerant, wherein a heat receiving section of the liquid cooling module is disposed between said first semiconductor element and said mounting substrate, and a plurality of secondary connecting bumps provided between said package substrate and said mounting substrate.

In this semiconductor device, a semiconductor element is provided between a mounting substrate and a package substrate, so that a space is formed between the semiconductor element and the mounting substrate. In this space, a liquid-cooling module cooling the semiconductor element is provided. This allows the semiconductor element to be cooled with a liquid-cooling module, and thus an allowable heating value can be increased.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE PREFERRED EMBODIMENTS

A semiconductor device of the present invention includes a package substrate, a memory element stacked on its top surface side by primary connection, a semiconductor element primarily connected to its undersurface side, and a secondary connecting bump surrounding the semiconductor element. Out of secondary connecting bump rows, at least one row extending in the outer perimeter direction from the inner perimeter is eliminated, and thereby a space that reaches the semiconductor element from the outside of the package is provided. A liquid cooling module and a conduit, which are separate components from the package, are disposed in the space. The secondary connecting bumps are desirably disposed so as to be linearly symmetrical with respect to the longitudinal center line or lateral center line of the package substrate surface, or to the longitudinal center line and lateral center line, or to be rotationally symmetrical with respect to the center point of the package substrate surface. The liquid cooling module is a laminated film including a thin resin film and a thin metallic film, and a channel is formed by thermo-compression bonding. A recessed portion equal to or larger than the size of the liquid cooling module shape is desirably formed at the mounting substrate side in the space between the mounting substrate and the semiconductor element.

The invention will be now described herein with reference to illustrative embodiments. Those skilled in the art will recognize that many alternative embodiments can be accomplished using the teachings of the present invention and that the invention is not limited to the embodiments illustrated for explanatory purposes.

(First Embodiment)

Figure 1:
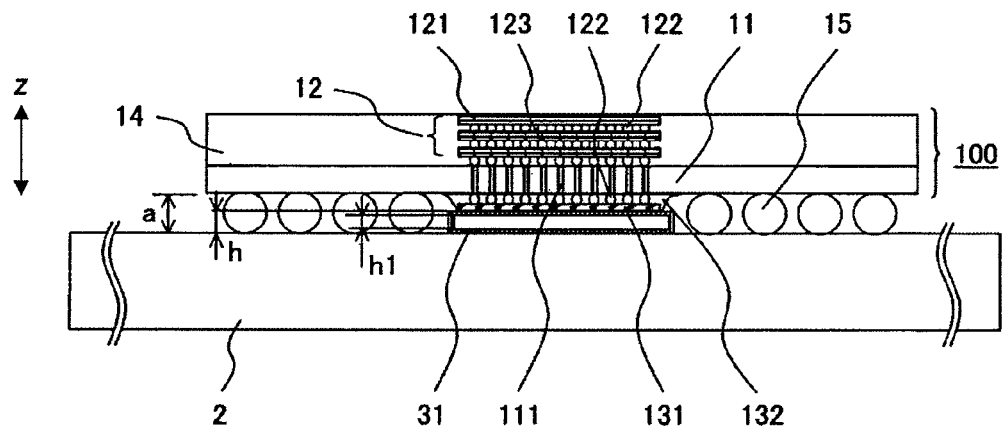
FIG. 1 is a side longitudinal sectional view showing a stacked package with a logic element being lowermost, a mounting substrate and a liquid cooling module in a first embodiment.

FIG. 1 is a side longitudinal sectional view of a semiconductor device in a first embodiment, and is a view showing the outline of its configuration. A stacked package with a logic element being lowermost (LEL) designated by reference numeral 100 in FIG. 1 includes stacked memory 12 at a top surface side of package substrate 11, and logic element 131 at an undersurface side.

Stacked memory 12 is formed by stacking a plurality of memory elements 121 in layers via primary connecting bumps 122, which are electrically connected to each other in the stacking direction by silicon through electrodes 123 formed inside memory elements 121. Memory elements 121 and their electrical connection portions are protected by mold resin 14. Logic element 131 is electrically connected to package substrate 11 via primary connecting bumps 122, and its electrical connection portion is protected by underfill 132. Logic element 131 and stacked memory 12 are electrically connected with through-holes 111 in the substrate.

Stacked package with LEL 100 is electrically connected to mounting substrate 2 via secondary connecting bumps 15. In this configuration, the path through which the electrical signal input from secondary connecting bump 15 is transmitted is in the sequence of logic element 131 and stacked memory 12.

Accordingly, the logic element can control distribution of signals to a plurality of memory elements 121 in advance, and therefore, signal delay can be minimized. In the space between the bottom surface of logic element 131 and the top surface of mounting substrate 2, heat receiving section 31 of the thin liquid cooling module made of laminated sheets is provided and is in close contact with them. When secondary connecting bump 15 is a solder ball, mounting height a is generally 0.5 mm or lower. Thickness h of heat receiving section 31 of the liquid cooling module is smaller than a due to the thickness of logic element 131. Channel height h1 of heat receiving section 31 of the liquid cooling module is smaller than h.

Generally, the heating value per one memory element 121 is hundreds of milliwatts or less. However, the heating value of logic element 131 is tens of watts and large. Therefore, if heat receiving section 31 of the liquid cooling module is brought into contact with logic element 131 to cool logic element 131, the allowable heating value can be significantly increased as will be described later.

In this embodiment, stacked memory 12 has a configuration in which a plurality of memory elements 121 are stacked in layers. However, the memory may be a single memory. Further, stacked memory 12 may have a configuration in which memory elements 121 and the logic element are stacked in layers. More specifically, stacked memory 12 may have a configuration in which the logic element is disposed between a plurality of memory elements 121. Further, the memory may have a configuration in which one or a plurality of memory elements 121 is or are disposed between a plurality of logic elements. Further, the member designated by numeral 12 may be a single or a plurality of logic elements, or may be a single or a plurality of other semiconductor elements.

Further, in this embodiment, the member designated by reference numeral 100 is a stacked package with LEL, and the object to be cooled by the liquid cooling module is logic element 131. However, the object to be cooled is not limited to this, and may be a memory element and another semiconductor element.

Here, the member designated by reference numeral 12 will be called a second semiconductor element. Further, in this case, the member designated by reference numeral 131 which is in contact with heat receiving section 31 will be called a first semiconductor element.

The heating value of the first semiconductor element is desirably larger than that of the second semiconductor element.

Further, the characteristics of the present invention are also included in a semiconductor device in the case where the second semiconductor element designated by reference numeral 12 is not present as a component of the semiconductor device, that is to say, in the case where only the first semiconductor element designated by 131, which may be simply called a semiconductor element in this case, is electrically connected to package substrate 11 via primary connecting bumps 122.

Figure 2:
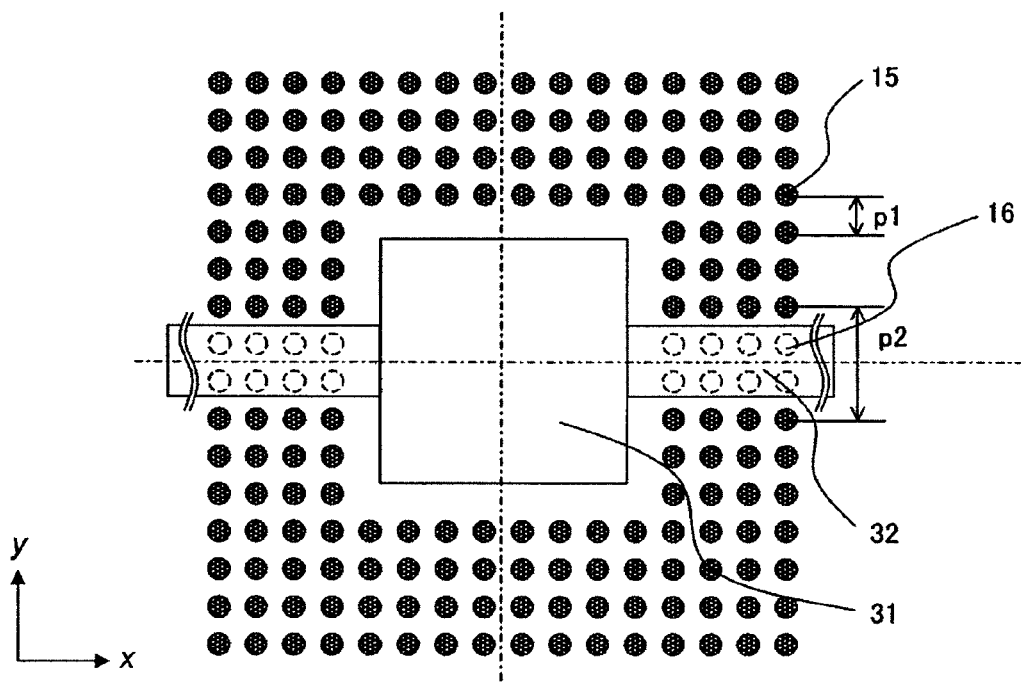
FIG. 2 is a plane view showing an arrangement of the liquid cooling module and a secondary connecting bump in the first embodiment.

FIG. 2 is a view showing an example of the arrangement of the liquid cooling module and the secondary connecting bumps in this embodiment. In this embodiment, there are two regions between package substrate 11 and mounting substrate 2. In one region, secondary connecting bumps 15 are in the form of being sandwiched between package substrate 11 and mounting substrate 2. In the other region where secondary connecting bumps 15 are not provided, heat receiving section 31 and conduit line 32 of the liquid cooling module are installed. Circle 16 shown by a dotted line shows the position of secondary connecting bump 15 which is to be provided when conduit line 32 is not installed. In this embodiment, secondary connecting bump 15 is not provided in the position of each of circles 16 shown by the dotted line.

In this embodiment, heat receiving section 31 and conduit line 32 of the liquid cooling module are disposed such that they are substantially symmetrical with respect to the horizontal center line (parallel to the x-axis) and the longitudinal center line (parallel to the y-axis) of package substrate 11. Further, since secondary connecting bumps 15 are not provided in the positions of circles 16 shown by the dotted line, space p2 between secondary connecting bumps 15 opposite to each other across conduit line 32 is larger than space p1 between bumps which are actually mounted.

Thereby, conduit line 32 can be made wide, and the pressure loss of the liquid cooling module can be reduced. Secondary connecting bumps 15 are substantially symmetrical with the axes as described above, and therefore, symmetry of the arrangement of a plurality of wirings inside the semiconductor package is kept, and the lengths of a plurality of wirings can be made substantially equal. Therefore, the resistances of a plurality of wirings can be made substantially equal, and the electrical characteristics of the semiconductor package can be prevented from being impaired.

Figure 3:
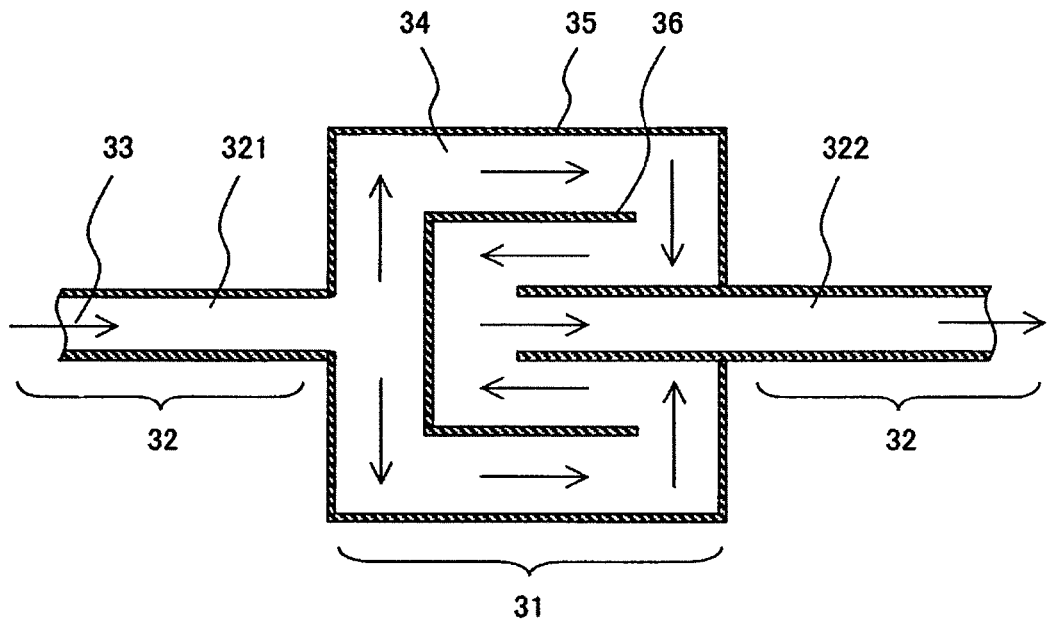
FIG. 3 is a cross-sectional view showing an internal structure of the liquid cooling module in the first embodiment.

FIG. 3 is a plane sectional view schematically showing the channel in the liquid cooling module according to this embodiment. In FIG. 3, refrigerant 33 (i.e., liquid refrigerant) flows in from inlet port 321, passes through channel 34 inside the liquid cooling module to flow out to outlet port 322 as shown by the arrows. Channel 34 is formed to be branched by outer wall 35 and inner wall 36 in heat receiving section 31 so that the refrigerant flows in the entire area of heat receiving section 31 while changing the flow direction.

FIGS. 4A, 4B, 5 and 6 show the heat receiving section shown in FIG. 3 during the manufacturing process thereof.

Figure 4A:
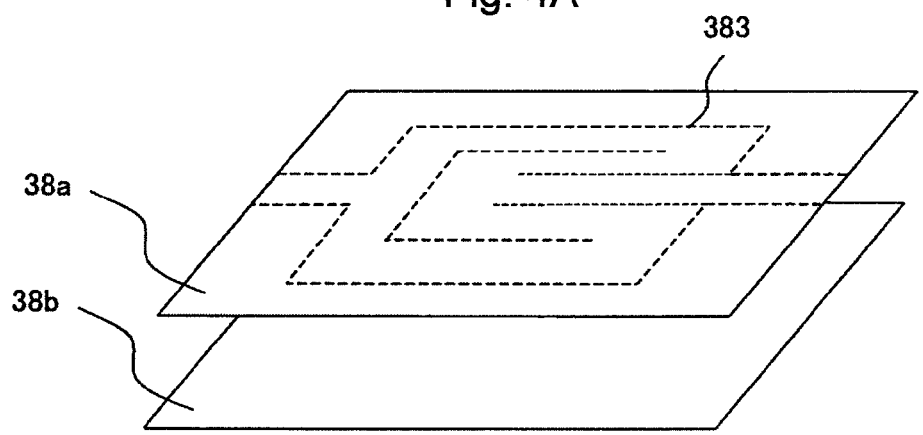
FIG. 4A is a perspective view showing the liquid cooling module in the first embodiment during the manufacturing process thereof.
Figure 4B:
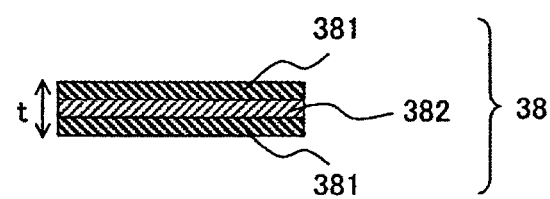
FIG. 4B is a partial sectional view showing one embodiment of the stacked film of FIG. 4A.
Figure 5:
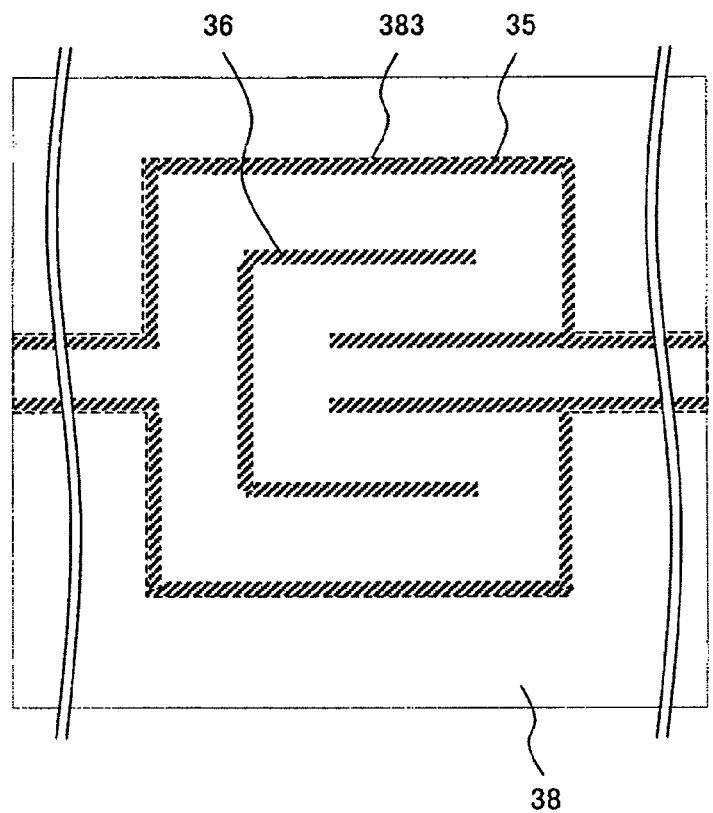
FIG. 5 is a plane view showing the liquid cooling module in the first embodiment during the manufacturing process thereof.
Figure 6:
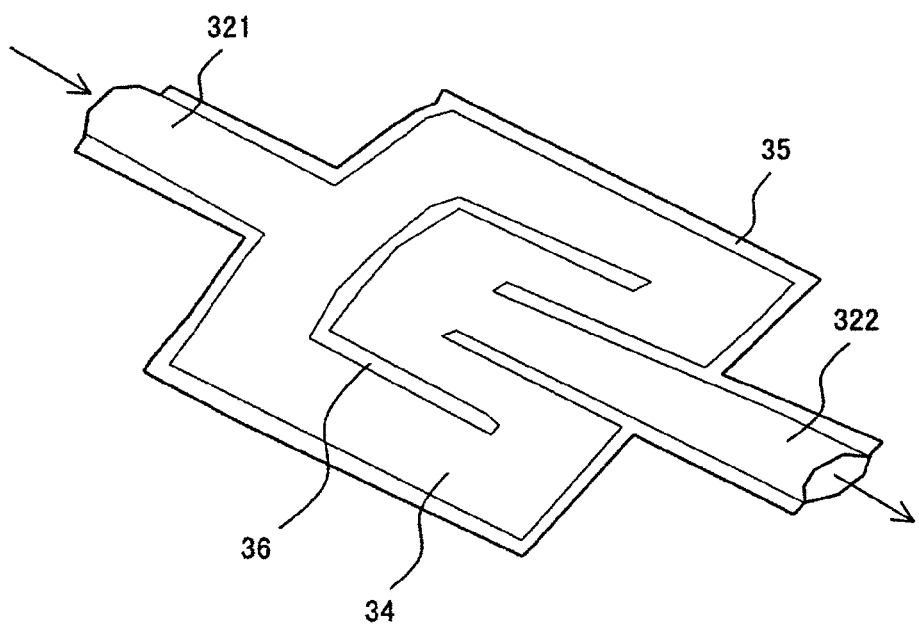
FIG. 6 is a perspective view showing a liquid cooling module in the first embodiment.

FIG. 4A is a perspective view showing a laminated film constituting the liquid cooling module. FIG. 4B is a partial sectional view of the laminated film. FIG. 5 is a plane view showing a portion to which thermo-compression bonding is to be applied in the laminated film that constitutes the liquid cooling module. FIG. 6 is a perspective view showing a completed liquid cooling module.

When the heat receiving section is manufactured, two laminated films 38a and 38b are superimposed on each another first as shown in FIG. 4A. Here, guide mark 383 for the channel is desirably printed in advance on at least one laminated film 38a.

Laminated film 38 is formed by laminating heat-resistant resin films 381 such as polyimide, aluminum foil 382 and the like. FIG. 4B shows a section of laminated film 38 in which aluminum foil 382 is sandwiched between two heat-resistant resin films 381. This allows it to have both heat resistance and water resistance. Thickness t of the resin film is about several micrometer to tens of micrometers.

Next, as shown in FIG. 5, thermo-compression bonding is applied along guide mark 383 for the channel, and thereby, outer wall 35 and inner wall 36 are produced. Subsequently, unnecessary portions of laminated film 38 outside outer wall 35 are cut off. FIG. 6 is a view showing a state in which a refrigerant flows through inlet port 321, channel 34 and outlet port 322 of the liquid cooling module. Due to the flow of the refrigerant, inlet port 321, channel 34 and outlet port 322 are inflated. Here, the portion to which thermo-compression bonding is applied is called a compression-bonded portion. Further, outer wall 35 and inner wall 36 will be called channel walls.

Figure 7A:
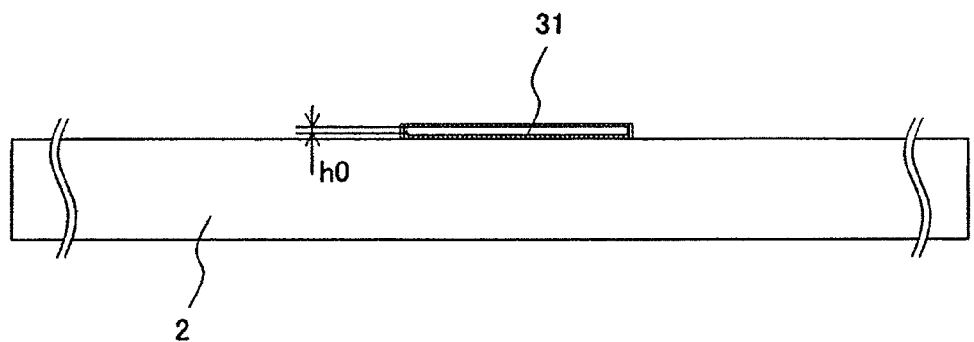
FIG. 7A is a side longitudinal sectional view showing a package during a first step of the assembly process thereof in the first embodiment.
Figure 7B:
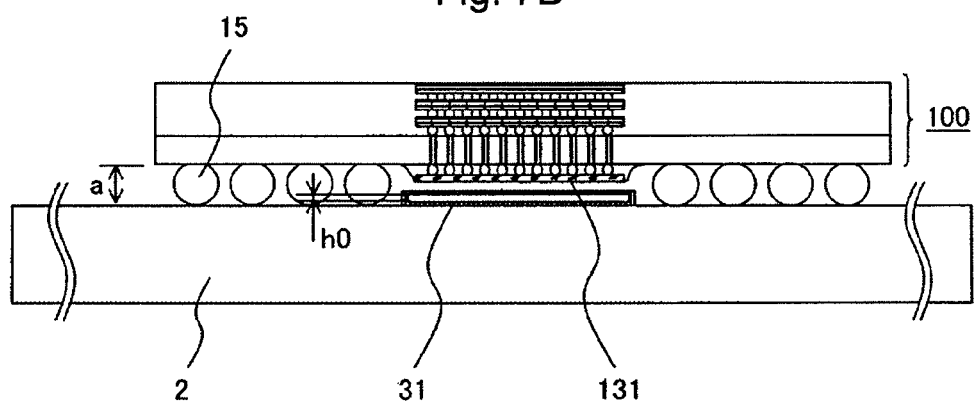
FIG. 7B is a side longitudinal sectional view showing a package during a second step of the assembly process thereof in the first embodiment.
Figure 7C:
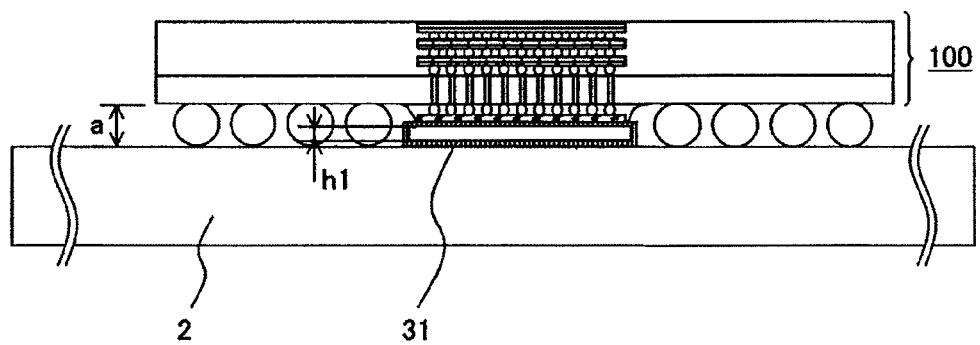
FIG. 7C is a side longitudinal sectional view showing a package of FIG. 7B of the state in which a refrigerant flows into the liquid cooling module.

FIGS. 7A, 7B and 7C are sectional views of the semiconductor device of this embodiment, showing the liquid cooling module and the semiconductor package on the mounting substrate during the steps of assembling process thereof.

First, as shown in FIG. 7A, the liquid cooling module is installed on mounting substrate 2. In FIG. 7A, only heat receiving section 31 is shown. At this time, there is no refrigerant inside the liquid cooling module, and therefore, channel height h0 is substantially 0 (zero).

Next, as shown in FIG. 7B, Stacked package with LEL 100 in which secondary connecting bumps 15 are disposed in the predetermined positions is placed above the liquid cooling module, and is mounted by reflow soldering at 260° C. on mounting substrate 2. Since the components of the liquid cooling module are made of a material having heat resistance such as polyimide, an aluminum foil and the like, they have sufficient heat resistance to the reflow temperature. Further, at this stage, there is a gap between heat receiving section 31 and logic element 131, and therefore, each solder, which is secondary connecting bump 15, can be mounted on each predetermined position by using a self-alignment technique.

Finally, the liquid cooling module is connected to the pump, the reservoir tank (both not shown) and the like. As shown in FIG. 7C, the refrigerant is injected into the channel of the liquid cooling module. The channel of heat receiving section 31 is inflated by injection of the refrigerant to reach height h1, and heat receiving section 31 is in close contact with the top surface of mounting substrate 2 and the undersurface of logic element 131. This enables logic element 131 to be cooled.

Here, the effect obtained by the semiconductor device of this embodiment will be described by referring to FIGS. 8 to 11.

Figure 8:
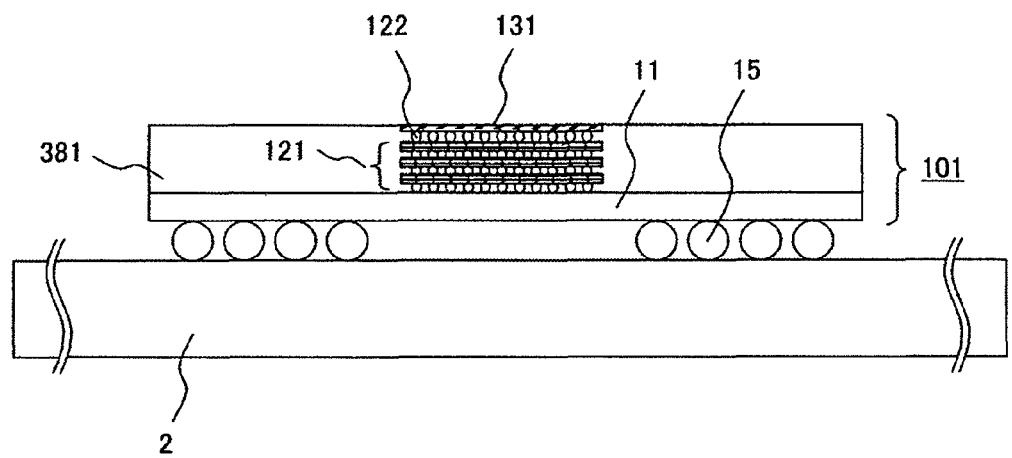
FIG. 8 is a sectional view showing a stacked package with a logic element being uppermost as a comparative example.
Figure 9:
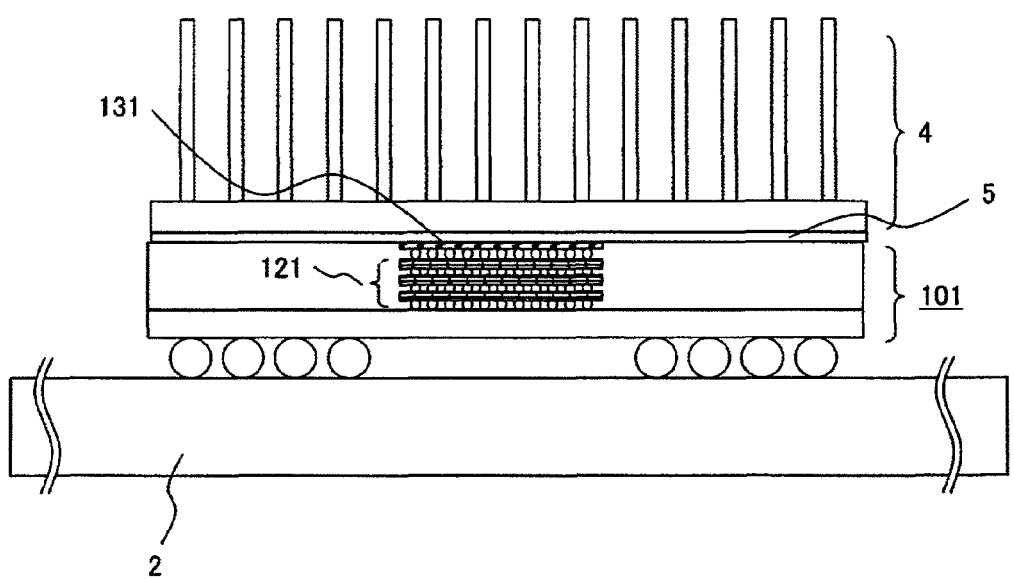
FIG. 9 is a sectional view showing the stacked package with a logic element being uppermost as the comparative example which is equipped with air-cooled fins.

FIG. 8 shows a sectional view of a stacked package with a logic element being uppermost (LEU) as a comparative example. In stacked package with LEU 101, logic element 131 is provided in the uppermost layer of the package, and the top surface of logic element 131 is exposed on the package top surface. FIG. 9 is a view showing a stacked package with LEU 101 as the comparative example in the case where air-cooled fins 4 are provided on the package top surface via heat conducting member 5 (e.g., a heat conducting sheet or grease) as an ordinary cooling means. In this case, cooling is performed by passing air into gaps between fins 4.

Next, the example is shown, in which forced-convection cooling is performed by providing the air-cooled fins having the same specifications in the case of a stacked package with LEL 100 and LEU 101, and the allowable heating values thereof are evaluated.

Figure 10:
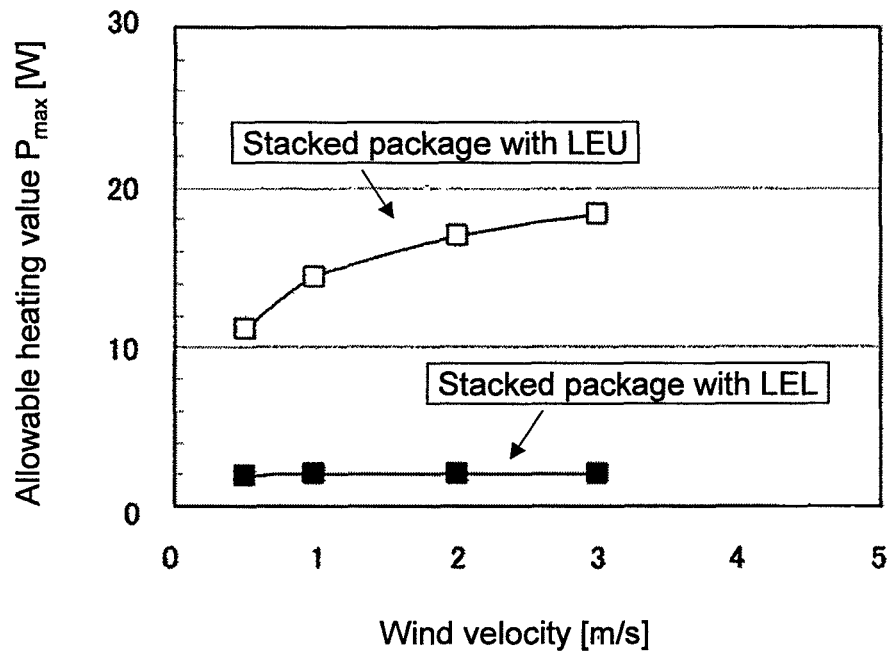
FIG. 10 is a graph showing an allowable heating value of the package of the comparative example, which is air-cooled by a fin.

FIG. 10 is a graph showing the allowable heating values of the stacked package with LEU and LEL when the air-cooled fins are provided and thermal hydraulic analysis is performed by varying the wind velocity as a parameter. FIG. 10 shows that the allowable heating value of 10 to 20 W is obtained by providing the air-cooled fins in the stacked package with LEU, whereas in the stacked package with LEL, 2 W is the limit even when the wind velocity is increased. This is caused by the heat resistance becoming large because the package substrate, memory element and the like are interposed in the heat radiation path between the lowermost logic element and the air-cooled fins. Specifically, it is clear that reduction in the heat resistance from the logic element to the heat radiator is important for increasing the allowable heating value of the logic element.

Figure 11:
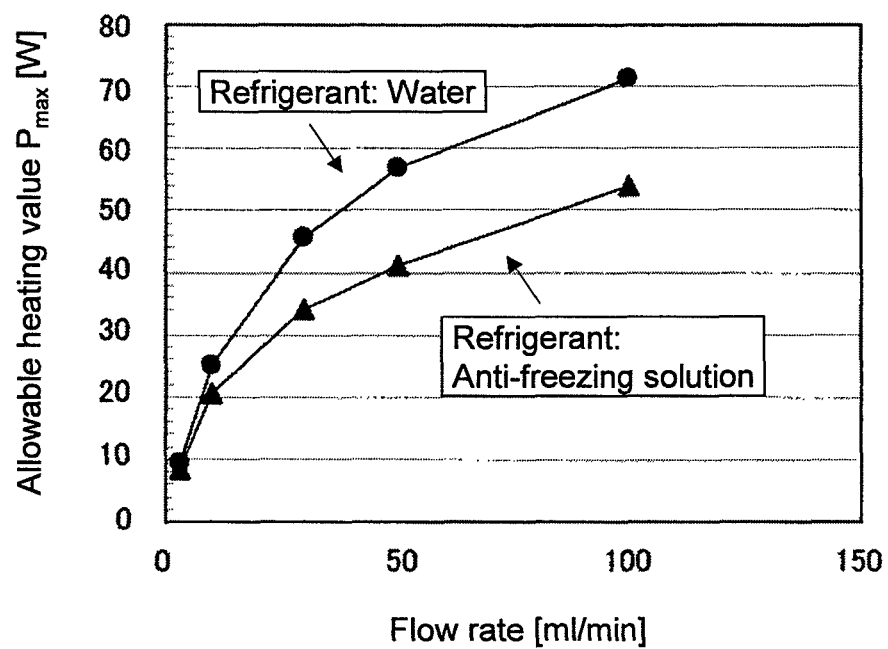
FIG. 11 is a graph showing an allowable heating value of the liquid cooling package according to the present invention.

FIG. 11 is a graph showing the allowable heating value of the stacked package with LEL shown in FIG. 1 when the thin liquid cooling module is brought into close contact with the undersurface thereof, and when thermal hydraulic analysis is performed by varying the kinds of the refrigerants and the flow rate as parameters. As the refrigerant, water or an anti-freezing solution is used.

FIG. 11 shows that the allowable heating value is 20 W or more even in the case of the refrigerant flow rate of 10 ml/min, and that the allowable heating value reaches 50 to 70 W when the refrigerant flow rate is 100 ml/min.

The heat radiating ability is larger in water than in an anti-freezing solution However, since water is likely to corrode the component such as a pump, the refrigerant is desirably an anti-freezing solution. Even the anti-freezing solution enables the allowable heating value of 50 W when the flow rate is 100 ml/min. In this way, the thin liquid cooling module allows the allowable heating value of the stacked package with LEL to be drastically increased.

Figure 12:
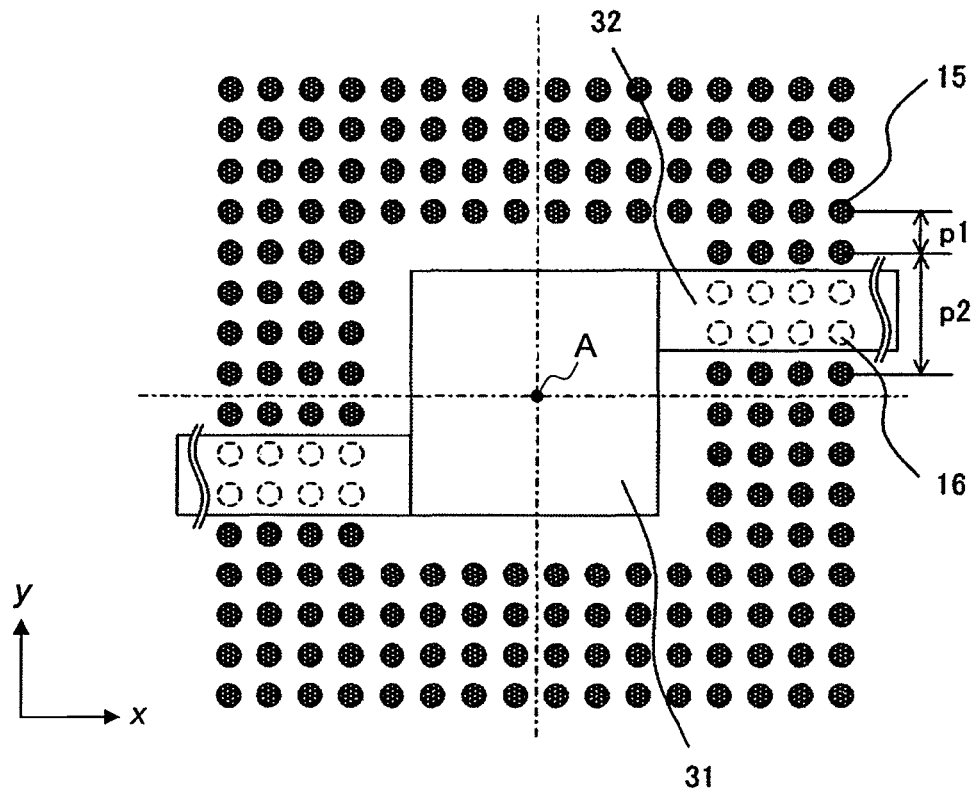
FIG. 12 is a plane view showing a first modified example of the secondary connecting bump and the liquid cooling module in the first embodiment.

FIG. 12 shows another example of the arrangement of the liquid cooling module and the secondary connecting bumps of this embodiment. Secondary connecting bumps 15 are arranged so as to be rotationally symmetrical with respect to the axis perpendicular to the paper surface through the package center point A. Conduit line 32 is disposed in the region of circles 16 shown by the dotted line, where secondary connecting bumps 15 are not provided. Since secondary connecting bumps 15 shown in FIG. 12 have a rotationally symmetrical arrangement, there is no possibility of deterioration of the electrical characteristics of the semiconductor package.

Figure 13:
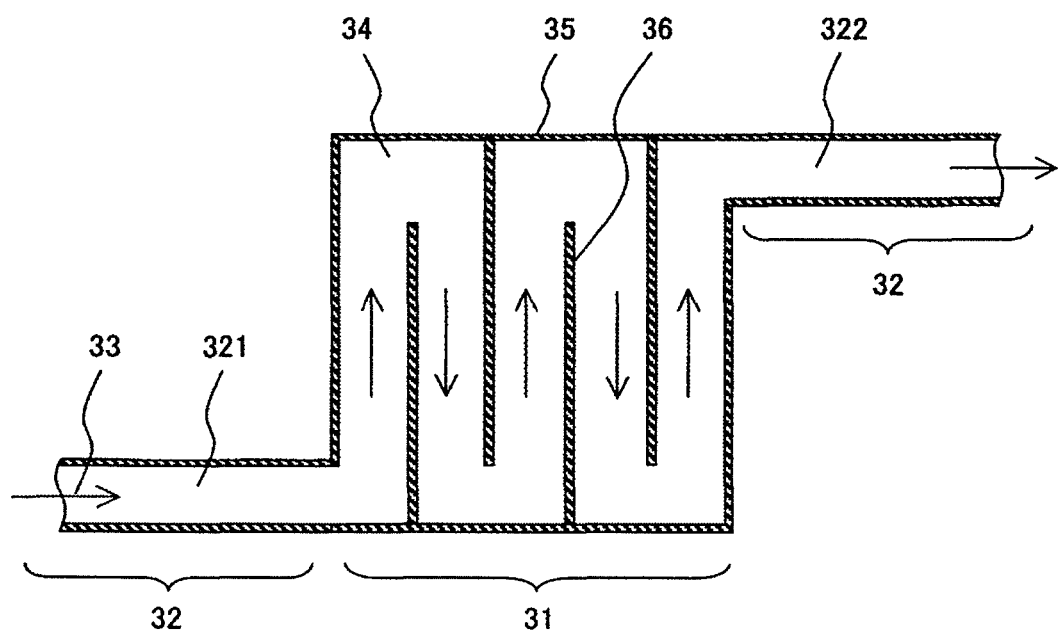
FIG. 13 is a sectional view showing an internal structure of the liquid cooling module of FIG. 12.

FIG. 13 is a sectional view showing an internal structure of the liquid cooling module of FIG. 12. The channel shape of FIG. 13 is a zigzag in which the flow direction of the refrigerant is reversed four times. However, the channel shape is not limited to this shape as long as the channel is formed continuously from inlet port 321 to outlet port 322 without interruption. In this embodiment, refrigerant 33 flows in from inlet port 321 at the lower left side, and flows out to outlet port 322 at the upper right side.

Figure 14:
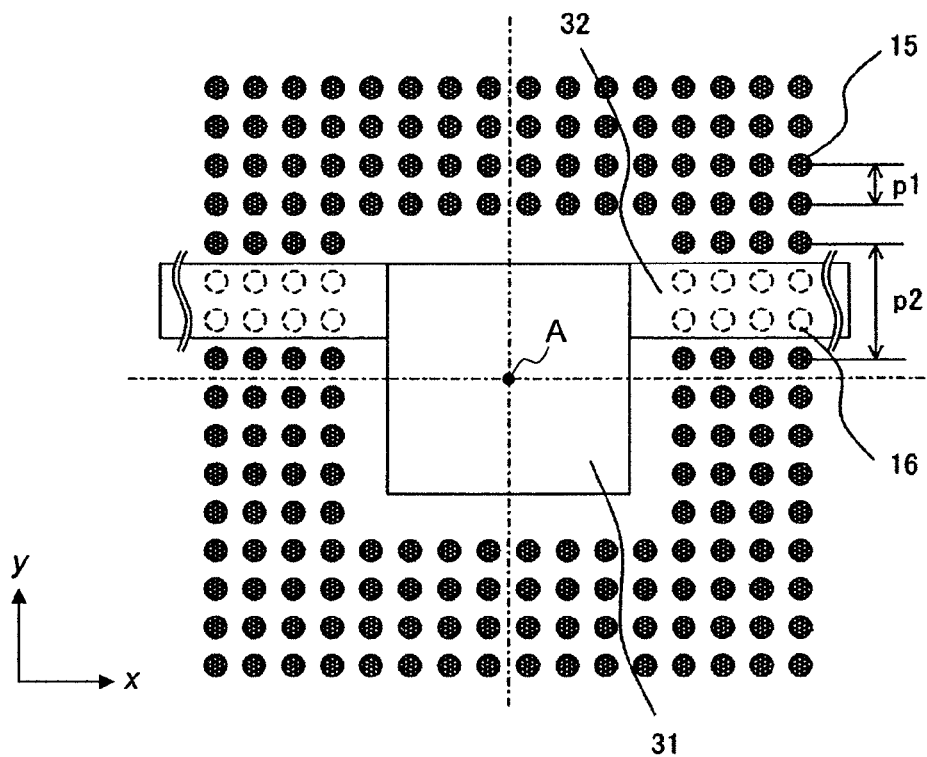
FIG. 14 is a plane view showing a second modified example of the secondary connecting bump and the liquid cooling module in the first embodiment.

FIG. 14 is a view showing another example of the arrangement of the liquid cooling module and the secondary connecting bumps of this embodiment. Secondary connecting bumps 15 are arranged so as to be mirror symmetrical with respect to the longitudinal line parallel to the y-axis passing through the package center point A. Conduit line 32 is disposed in the region of circles 16 shown by the dotted line, where secondary connecting bumps 15 are not provided. Since secondary connecting bumps 15 shown in FIG. 14 have a mirror symmetrical arrangement, there is no possibility of deterioration of the electric characteristics of the semiconductor package.

Figure 15:
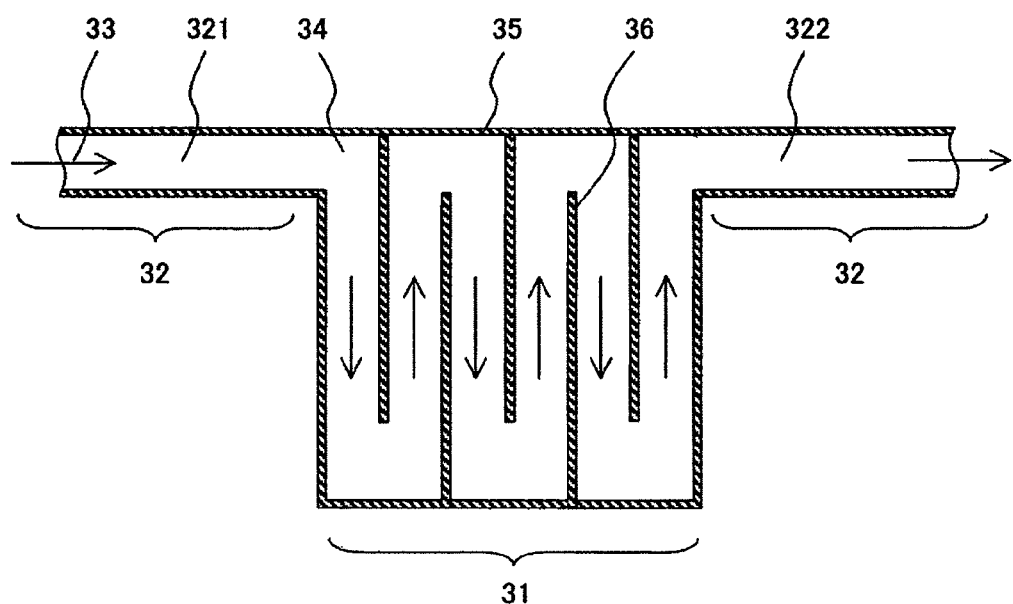
FIG. 15 is a sectional view showing an internal structure of the liquid cooling module of FIG. 14.

FIG. 15 is a sectional view showing an internal structure of the liquid cooling module of FIG. 14. The channel shape of FIG. 15 is a zigzag in which the flow direction of the refrigerant is reversed five times. However, the channel shape is not limited to this shape as long as the channel is formed continuously from inlet port 321 to outlet port 322 without interruption.

Figure 16:
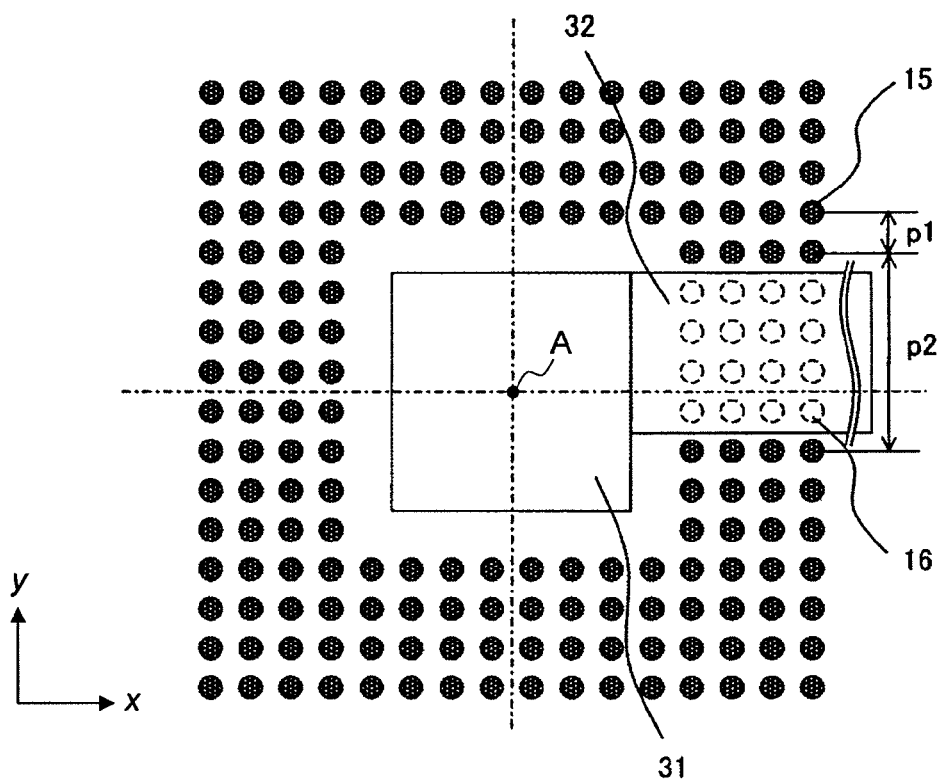
FIG. 16 is a plane view showing a third modified example of the secondary connecting bump and the liquid cooling module in the first embodiment.

FIG. 16 is a view showing another example of the arrangement of the liquid cooling module and the secondary connecting bump of this embodiment. Secondary connecting bumps 15 are not symmetrical with respect to the longitudinal and horizontal lines (parallel to the y- and x-axes) passing through the package center point A. Conduit line 32 is disposed in the region of circles 16 shown by the dotted line, where secondary connecting bumps 15 are not provided. Secondary connecting bumps 15 shown in FIG. 16 have no symmetrical arrangement. However, when priority is given to disposing the liquid cooling module, such an arrangement can be adopted.

Figure 17:
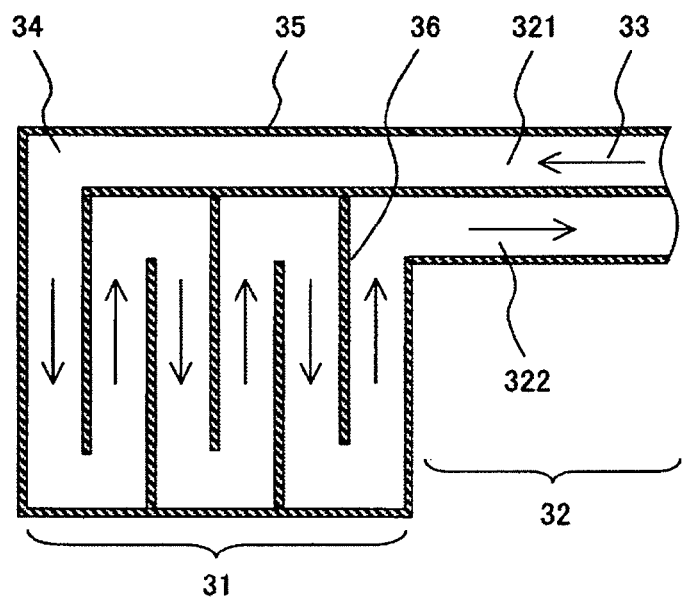
FIG. 17 is a sectional view showing an internal structure of the liquid cooling module of FIG. 16.

FIG. 17 is a sectional view showing an internal structure of the liquid cooling module of FIG. 16. In this case, inlet port 321 and outlet port 322 are separated by a wall to be disposed adjacent to each other. The channel shape of FIG. 17 is a zigzag in which refrigerant 33, which flows into heat receiving section 31 from inlet port 321, turns over five times after reaching the opposite side of inlet port 321 and after turning 90°. However, the channel shape is not limited to this shape as long as the channel is formed continuously from inlet port 321 to outlet port 322 without interruption.

Figure 18:
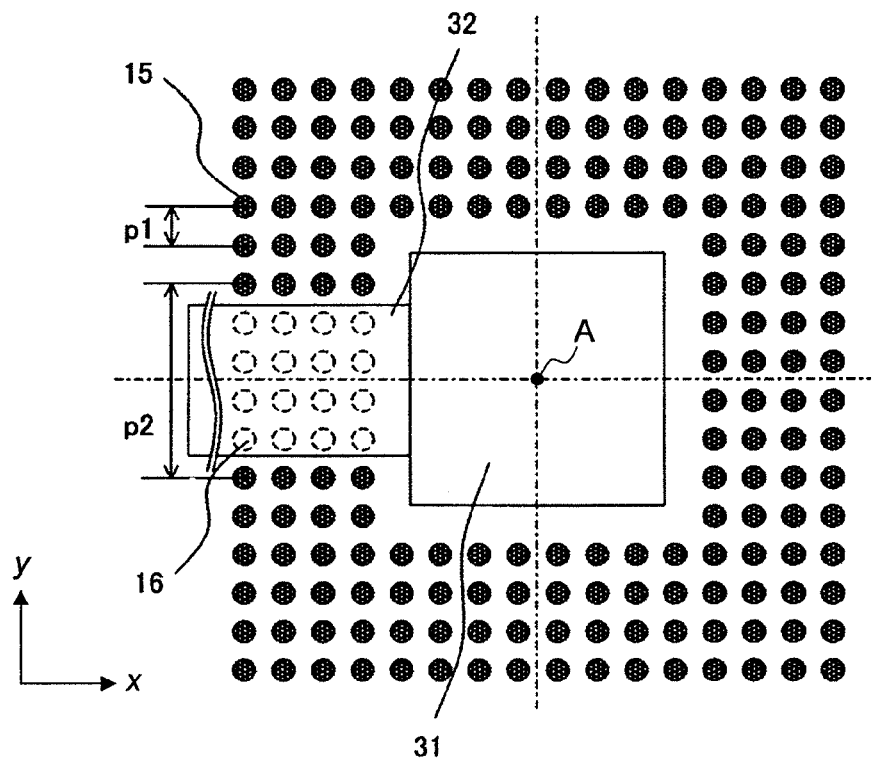
FIG. 18 is a plane view showing a fourth modified example of the secondary connecting bump and the liquid cooling module in the first embodiment.

FIG. 18 is a view showing another example of the arrangement of the liquid cooling module and the secondary connecting bump of this embodiment. Secondary connecting bumps 15 are arranged so as to be mirror symmetrical with respect to the horizontal line parallel to the x-axis passing through the package center point A. Conduit line 32 is disposed in the area of circles 16 shown by the dotted line, where secondary connecting bumps 15 are not provided. Secondary connecting bumps 15 shown in FIG. 18 have a mirror symmetrical arrangement, and thus there is no possibility of deterioration of the electric characteristics of the semiconductor package. Arrangement of secondary connecting bumps 15 is not limited to that of FIG. 18, and may be an arrangement in which the mirror symmetry with respect to the longitudinal center line parallel to the y-axis is kept.

Figure 19:
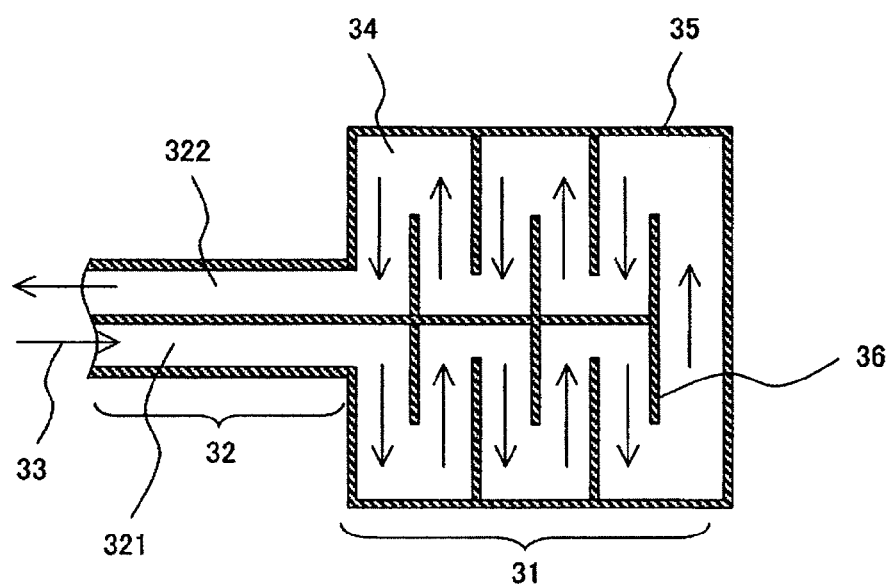
FIG. 19 is a sectional view showing an internal structure of the liquid cooling module of FIG. 18.

FIG. 19 is a sectional view showing an internal structure of the liquid cooling module of FIG. 18. The channel shape of FIG. 19 is a zigzag in which the flow of refrigerant 33, which flows into heat receiving section 31 from inlet port 321, is turned five times in a half region of heat receiving section 31 and further turned five times in the other half region thereof to flow out to outlet port 322. The channel shape is not limited to this shape as long as the channel is formed continuously from inlet port 321 to outlet port 322 without interruption.

Figure 20:
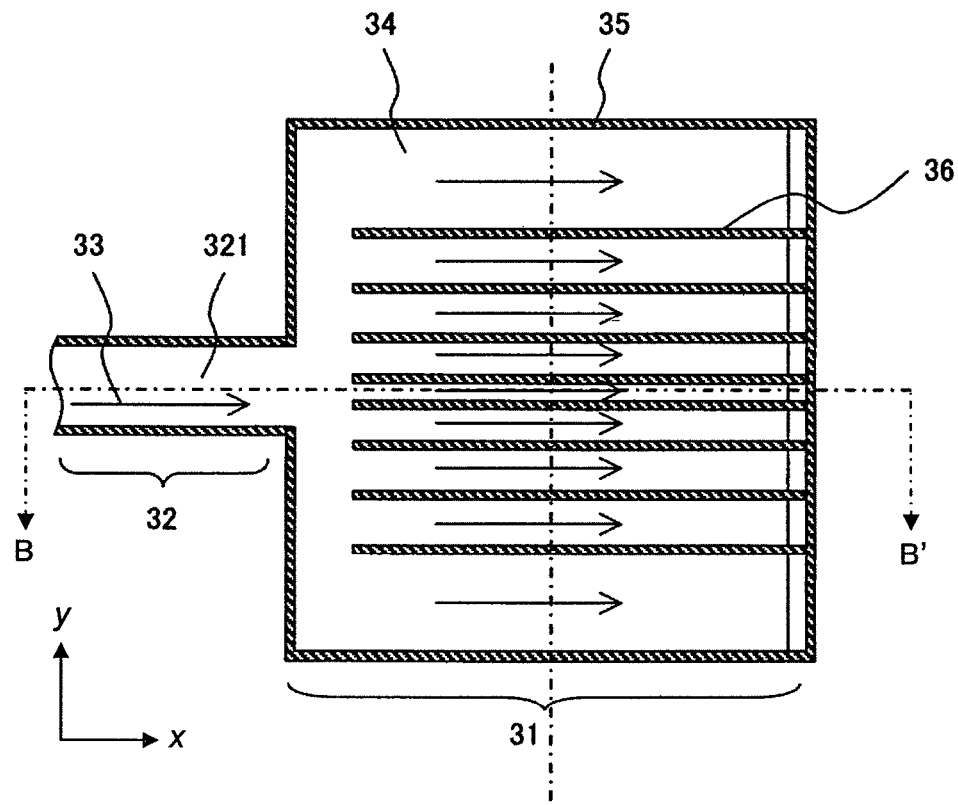
FIG. 20 is a plane view showing a fifth modified example of the secondary connecting bump and the liquid cooling module in the first embodiment.
Figure 21:
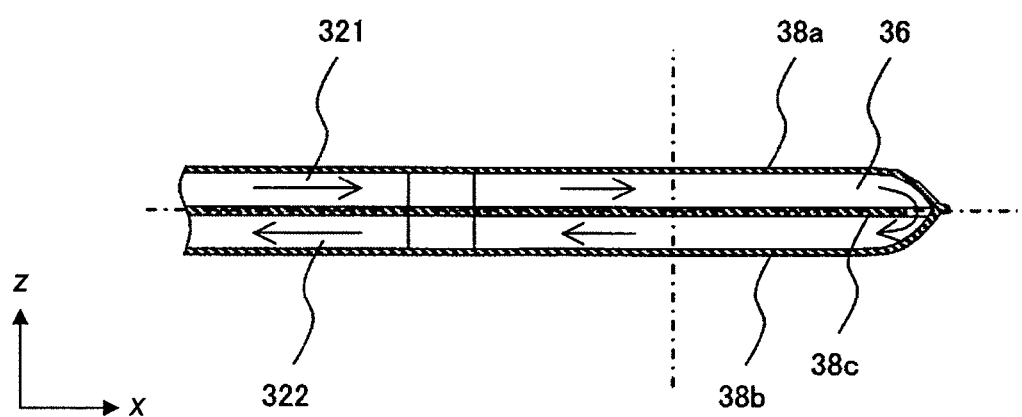
FIG. 21 is a sectional view taken along line B-B' of FIG. 20.

FIG. 20 is a sectional view showing an internal structure of another example of the configuration of the liquid cooling module. FIG. 21 is a sectional view taken along line B-B' of FIG. 20.

In this configuration, the channel is three-dimensional. As shown in FIG. 20, refrigerant 33 flows into heat receiving section 31 from inlet port 321, and passes through a plurality of flow paths which are formed such that the flow path nearer to the horizontal center line (parallel to the x-axis) has a narrower width. Thereafter, the flow of refrigerant 33 is turned at the opposite side of inlet port 321 to flow out through outlet port 322. Since the difference in distance between inner walls 36 causes a difference in distribution of the channel resistance, refrigerant 33 that flows into heat receiving section 31 from the region near the horizontal center line can be distributed to all of the flow paths. More specifically, the flow path width, which is the distance between inner walls 36, near the horizontal center line becomes narrow, and the flow path width far from the horizontal center line becomes wide. Thereby, the flow rate in the flow path near the horizontal center line is limited, and the flow rate in the flow path far from the horizontal center line is ensured. As a result, the flow velocities in the respective flow paths become substantially equal, so that the heat flux (i.e., heat flow rate per unit area) of heat receiving section 31 is made substantially uniform independent of the flow path.

As shown in FIG. 21, the horizontal length of the inner wall formed by laminated film 38c is shorter than those of laminated films 38a and 38b, and thereby, a flow path for turning the flow of refrigerant 33 is ensured. The configuration of the distance between inner walls 36 is not limited to that in this channel shape. Further, while the flow rate (i.e., flow velocity) of each flow path is regulated (i.e., made substantially equal) by changing the distance between inner walls 36 (i.e., flow path width) in the channel before turning the flow as shown in FIG. 20, the flow path widths in the channel after turning the flow can be made substantially equal to each other. More specifically, the structure may be adopted, in which the configuration of the distance between inner walls 36 (i.e., flow path width) is changed before and after turning the flow.

Figure 22:
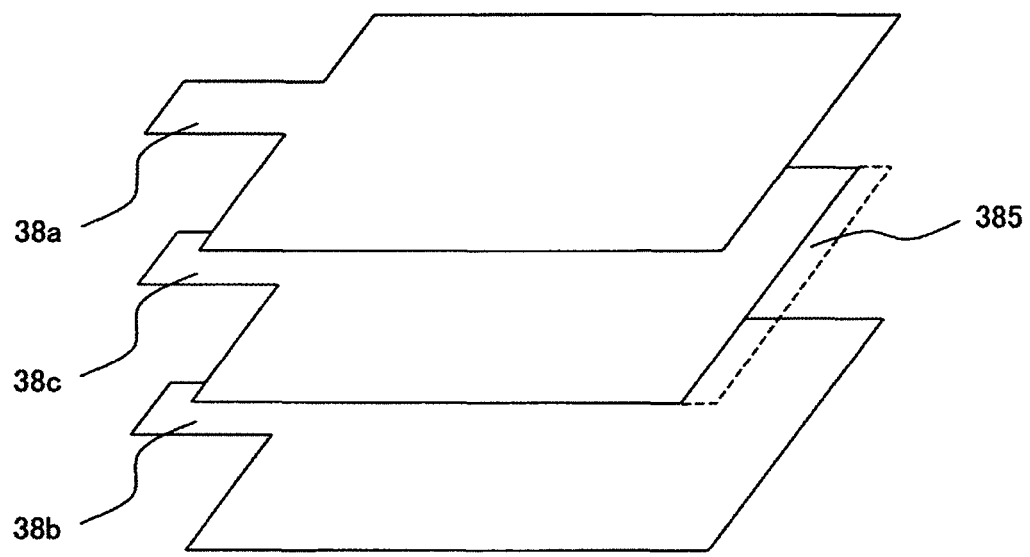
FIG. 22 is a perspective view showing the liquid cooling module of FIGS. 20 and 21 during the manufacturing process thereof.
Figure 23:
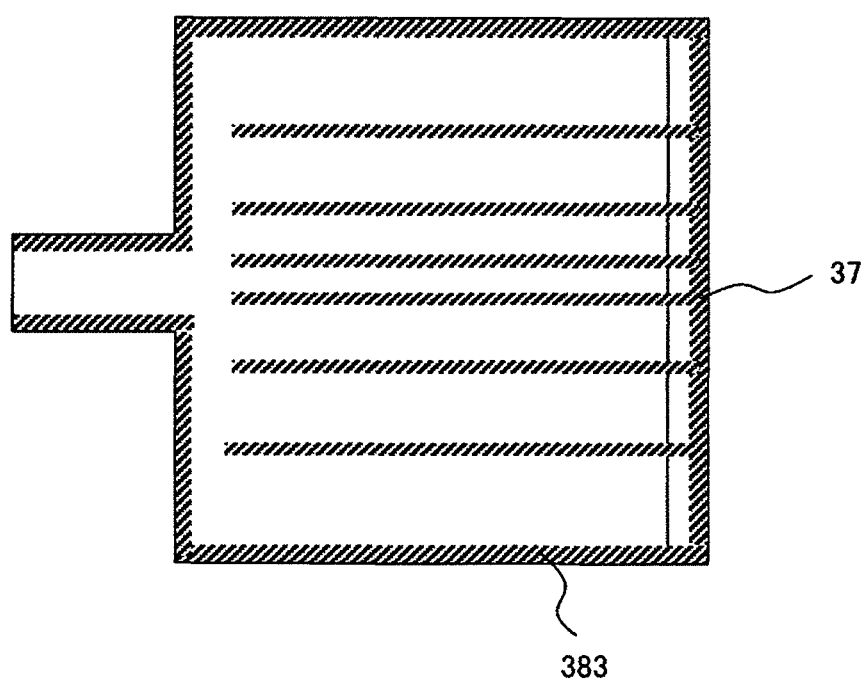
FIG. 23 is a plane view showing the liquid cooling module of FIGS. 20 and 21 during the manufacturing process thereof.

FIGS. 22 and 23 show an example of a three-dimensional channel during the manufacturing process thereof. As shown in FIG. 22, three laminated films 38a, 38b and 38c are superimposed on one another. Among them, the laminated film designated by 38c to be the inner wall has cut portion 385 at the right-hand side of FIG. 22, so that it is shorter than the other two films. As shown in FIG. 23, after three films are superimposed on one another, outer wall 35 and inner wall 36 of the channel are formed by thermo-compression bonding along guide mark 383. Here, an example is shown in which films that are cut into the shape of the liquid cooling module are used. However, as shown in FIGS. 4 to 6, after thermocompression bonding by using sheets that are larger than the size of the liquid cooling module, unnecessary portions may be cut off.

(Second Embodiment)

Figure 24:
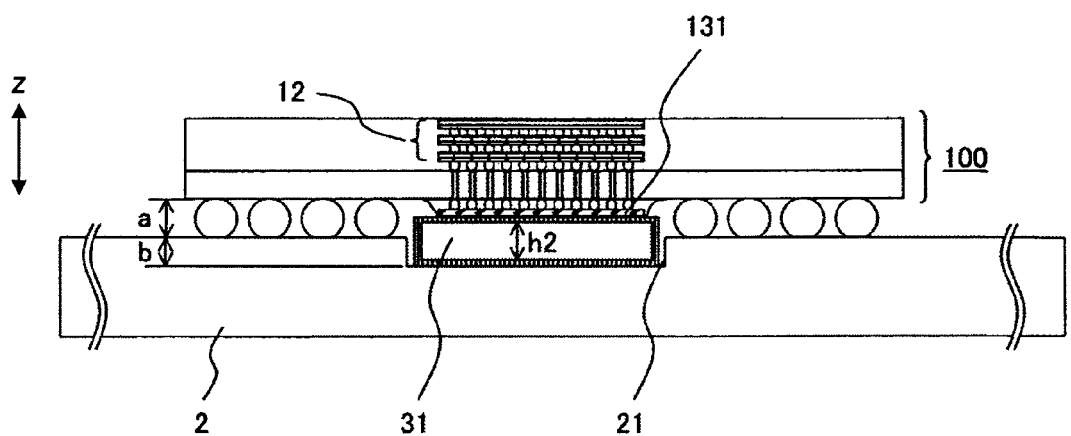
FIG. 24 is a side longitudinal sectional view showing a stacked package with a logic element being lowermost, a mounting substrate and a liquid cooling module in a second embodiment.

FIG. 24 shows a side sectional view of a semiconductor device in a second embodiment. The configuration of a stacked package with LEL 100 is the same as that of the first embodiment. However, in this embodiment, recessed portion 21 is provided in mounting substrate 2, and thereby, channel height h2 of the liquid cooling module is increased. For example, if recessed portion 21 of 0.5 mm is provided in the mounting substrate of 1.27 mm, the channel height which is about twice as high as that of the first embodiment can be ensured, and the pressure loss of the channel of heat receiving section 31 can be reduced.

Figure 25:
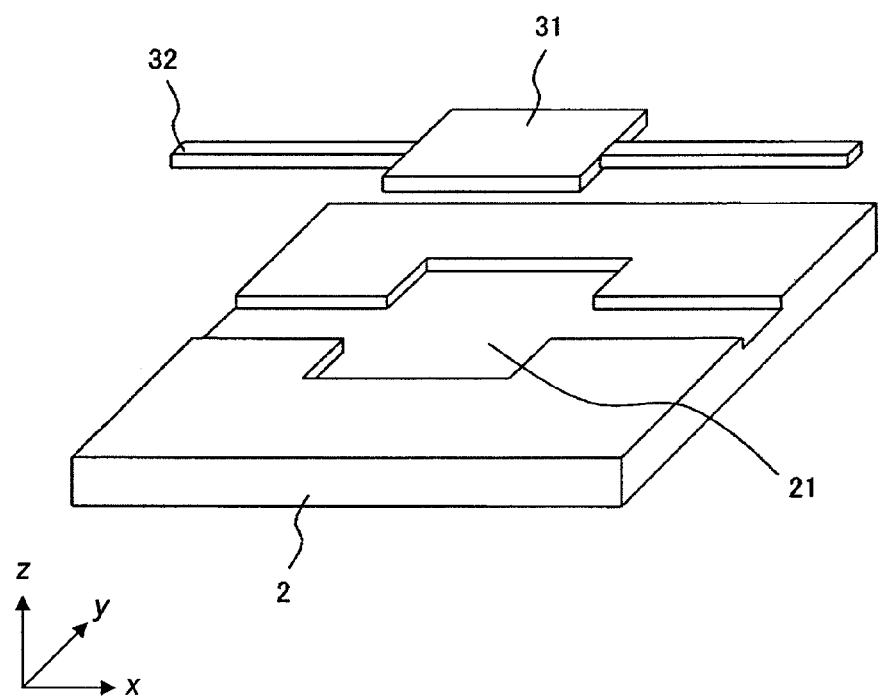
FIG. 25 is a perspective view showing a recessed portion of the mounting substrate of FIG. 24.

FIG. 25 is a perspective view showing the liquid cooling module and the mounting substrate of this embodiment. As shown in FIG. 25, recessed portion 21 of the mounting substrate is formed into a size which is an outside dimension of heat receiving section 31 and conduit line 32, or larger. By providing recessed portion 21 in the mounting substrate, positioning when mounting the liquid cooling module is facilitated.

(Third Embodiment)

Figure 26:
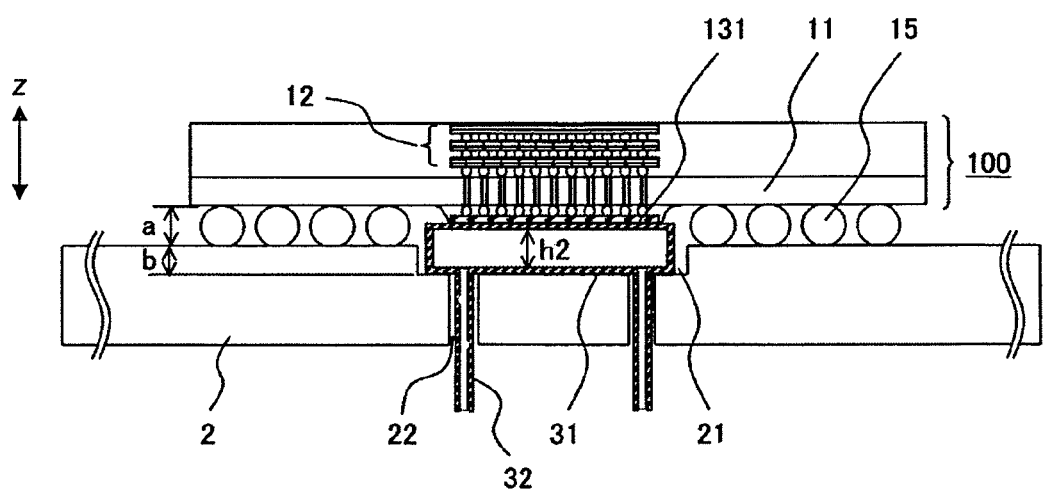
FIG. 26 is a side longitudinal sectional view showing a stacked package with a logic element being lowermost, a mounting substrate and a liquid cooling module in a third embodiment.

FIG. 26 shows a side sectional view of a semiconductor device in a third embodiment. The configuration of a stacked package with LEL 100 is the same as those of the first and second embodiments. In this embodiment, as in the second embodiment, recessed portion 21 for increasing channel height h2 of heat receiving section 31 and hole 22 (i.e., a through-hole) for receiving conduit line 32 are provided in mounting substrate 2. By passing conduit line 32 through mounting substrate 2, as compared with the second embodiment, the channel sectional area of conduit line 32 is increased and the pressure loss can be reduced. Further, there is no need to dispose conduit line 32 between package substrate 11 and mounting substrate 2, and therefore, as compared with the first and second embodiments, the number of secondary connecting bumps 15, that is, the number of input and output terminals, which are to be disposed therebetween, can be increased.

Figure 27:
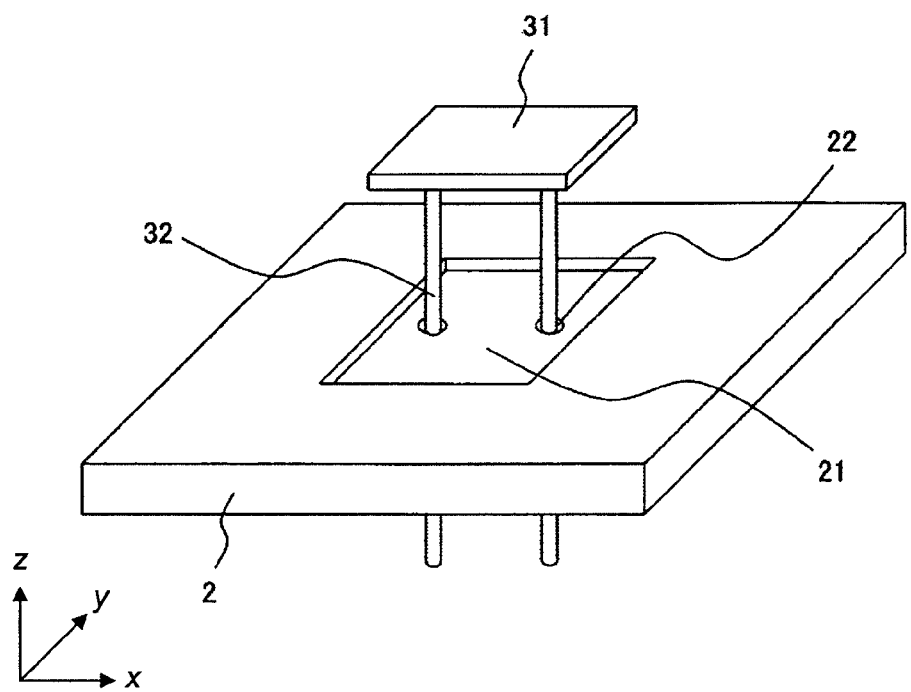
FIG. 27 is a perspective view showing the recessed portion and a hole of the mounting substrate of FIG. 24.

FIG. 27 is a perspective view showing the liquid cooling module and the mounting substrate of this embodiment. As shown in FIG. 27, recessed portion 21 of mounting substrate 2 is formed into a size which is an outside dimension of heat receiving section 31 and conduit line 32, or larger. Further, hole 22 slightly larger than conduit line 32 is provided at recessed portion 21.

Figure 28:
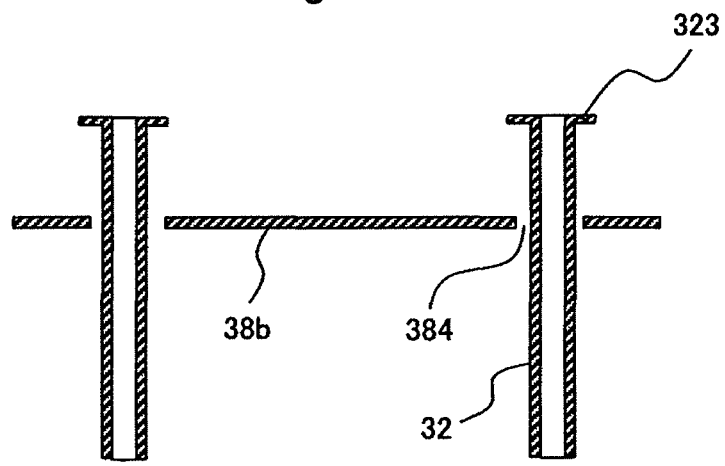
FIG. 28 is a side longitudinal sectional view showing a package during a first step of the assembly process thereof in the third embodiment.
Figure 29:
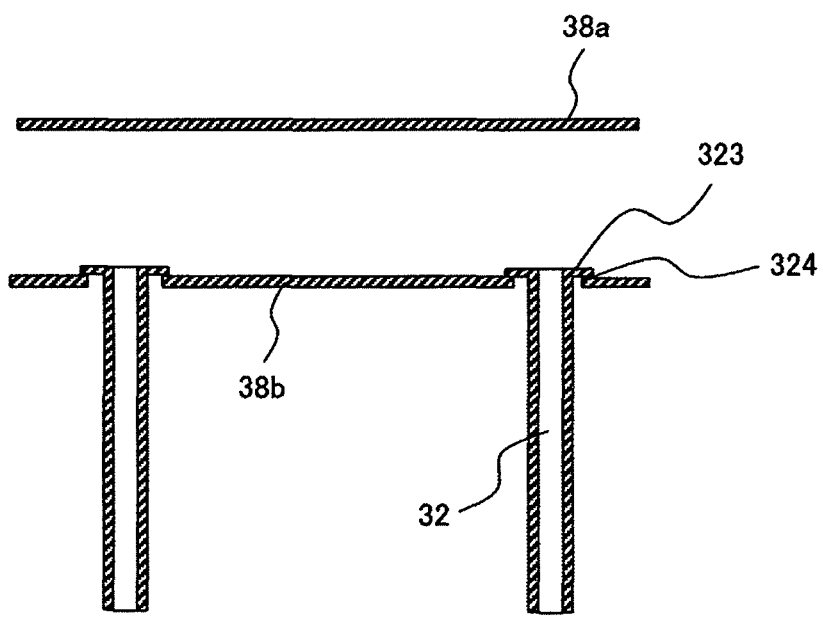
FIG. 29 is a side longitudinal sectional view showing a package during a second step of the assembly process thereof in the third embodiment.
Figure 30:
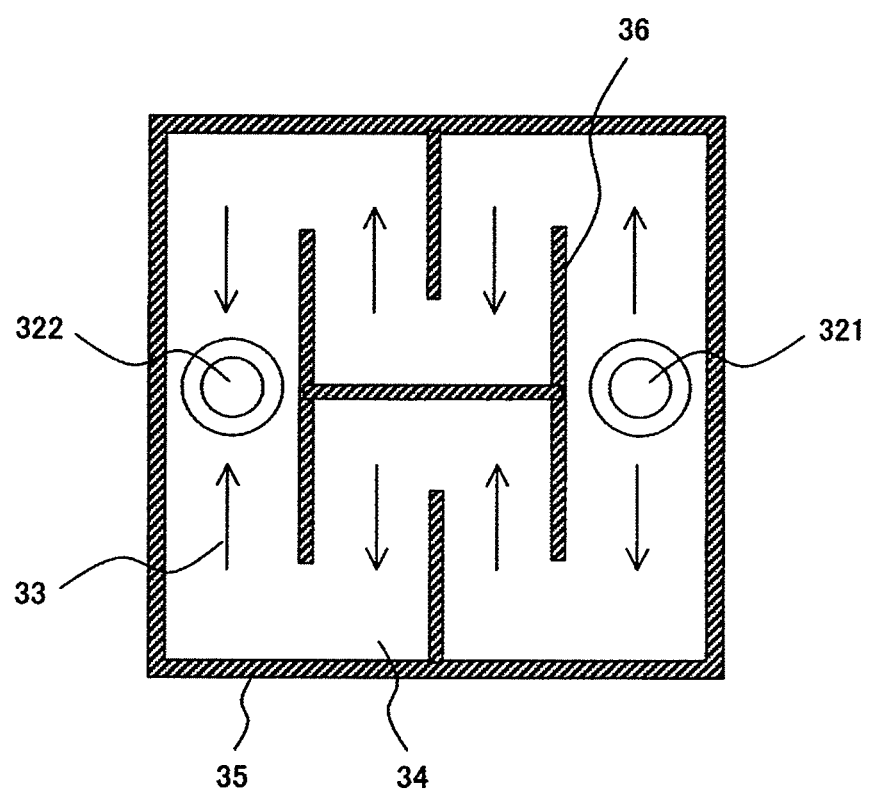
FIG. 30 is a sectional view showing a liquid cooling module in the third embodiment.

FIGS. 28 to 30 are views showing the liquid cooling module of this embodiment during the steps of the assembly process thereof. FIG. 28 is a side longitudinal sectional view showing the liquid cooling module of this embodiment during a first step in the assembly process thereof. FIG. 29 is a side longitudinal sectional view showing the liquid cooling module of this embodiment during a second step of the assembly process thereof. FIG. 30 is a sectional view showing the liquid cooling module of this embodiment.

First, as shown in FIG. 28, cylindrical conduit line 32 provided with flange 323 is inserted into hole 384 formed in laminated film 38b.

Next, as shown in FIG. 29, after thermo-compression bonding flange 323 of conduit line 32 to laminated film 38b, laminated film 38a is superimposed thereon.

Finally, as shown in FIG. 30, part of laminated films 38a and 38b are bonded to each other by thermo-compression bonding. As a result, outer wall 35 and inner wall 36, and thereby channel 34 are formed. Refrigerant 33 flows in from inlet port 321 and out to outlet port 322.

According to the present invention, the following effect is obtained.

A signal to the stacked memory can be transmitted over the shortest path through the logic element, so that high speed communication is enabled.

Further, the liquid cooling module allows the logic element to be cooled, so that the allowable heating value can be increased.

Further, the liquid cooling module can be made so thin as to be placed in a narrow space between the logic element and the mounting substrate.

Further, the conduit line from the outside of the semiconductor device to the liquid cooling module can be ensured.

Further, the secondary connecting bumps can have line symmetrical or rotationally symmetrical arrangements, so that there is no possibility that the electrical characteristics will deteriorate.

Further, the liquid cooling module is a separate component from the semiconductor device, in other words, the channel can separate from the wiring circuit surface of the logic element. Therefore, there is no possibility that the wiring circuit surface and the electrical connection portions will deteriorate due to corrosion.

Further, the liquid cooling module is composed of the laminated film in which the metal foil is sandwiched between the heat-resistant thin resin films. Therefore, the liquid cooling module has solder reflow resistance and high water resistance. Further, the liquid cooling module can be installed before the package is mounted and can be prevented from causing leakage of the refrigerant liquid.

Further, positioning for mounting of the liquid cooling module is facilitated in cases where the recessed portion, that corresponds to the liquid cooling module in the mounting substrate, is provided.

Further, an increase in the channel sectional area of the conduit line is facilitated in cases where the hole for receiving the conduit line in the mounting substrate is provided, so that the pressure loss can be reduced. Further, there is no need to dispose the conduit line between the package substrate and the mounting substrate, and therefore, the number of input and output terminals disposed therebetween can be increased.

It is apparent that the present invention is not limited to the above embodiments, but may be modified and changed without departing from the scope and spirit of the invention.

What is claimed is:

1. A semiconductor device, comprising:
a first substrate having a upper surface and a bottom surface;
a first semiconductor memory element comprising a stack of a plurality of semiconductor memory elements including a second semiconductor memory element and a third semiconductor memory element stacked on the second semiconductor memory element, provided above said upper surface of said first substrate, a first primary connecting bump being provided between the second semiconductor memory element and the third semiconductor memory element, and a second primary connecting bump provided between the second semiconductor memory element and said first substrate, the third semiconductor memory element being electrically connected to said first substrate through a through electrode formed inside the second semiconductor memory element, an uppermost semiconductor memory element of the first semiconductor memory element having no through electrode;

a plurality of secondary connecting bumps directly connected to said bottom surface of said first substrate, such that a space is formed between the plurality of secondary connecting bumps; and a cooling module comprising a heat receiving section disposed on the bottom surface of the first substrate and in the space formed between the plurality of secondary connecting bumps, the cooling module further comprising a refrigerant flowing through the heat receiving section.

2. The semiconductor device according to claim 1, wherein the heat receiving section expands when the refrigerant flows through the cooling the cooling module.

* * * * *